(12) United States Patent
Fujita (10) Patent No.: US 6,219,269 B1
(45) Date of Patent: Apr. 17, 2001

(54) SEMICONDUCTOR MEMORY DEVICE CAPABLE OF IMPROVING READ OPERATION SPEED

(75) Inventor: Mamoru Fujita, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/547,934

(22) Filed: Apr. 11, 2000

(30) Foreign Application Priority Data

Apr. 13, 1999 (JP) .................................................. 11-105953

(51) Int. Cl.[7] ..................................................... G11C 5/06
(52) U.S. Cl. ......................... 365/63; 365/230.03; 365/207
(58) Field of Search ................................. 365/63, 230.03, 365/230.06, 189.01, 189.11, 196, 207

(56) References Cited

U.S. PATENT DOCUMENTS 5,943,253 * 8/1999 Matsumiya et al. .................... 365/63

FOREIGN PATENT DOCUMENTS

| 5-120876 | 5/1993 | (JP) | ............................. G11C/11/409 |
| 6-20465 | 1/1994 | (JP) | ............................. G11C/11/401 |
| 9-27190 | 1/1997 | (JP) | ................................. G11C/8/04 |

* cited by examiner

Primary Examiner—David Nelms
Assistant Examiner—David Lam
(74) Attorney, Agent, or Firm—Hayes, Soloway, Hennessey, Grossman & Hage, P.C.

(57) ABSTRACT

In a semiconductor memory device including a plurality of sense amplifiers arranged in rows, columns, a plurality of local data input/output line pairs, each pair being connected to one row of the sense amplifiers, a global data input/output line pair, a plurality of switches each connected between one of the local data input/output line pairs and the global data input/output line pair, and a differential amplifier connected to the global data input/output line pair, at least one pull-up circuit is connected to the global data input/output line pair. At least one of the switches is connected to the global data input/output line pair between the pull-up circuit and the differential amplifier.

10 Claims, 14 Drawing Sheets

Fig. 1 PRIOR ART

| MCA | SWD | MCA | SWD | MCA | SWD | MCA | SWD | XDEC |
|-----|-----|-----|-----|-----|-----|-----|-----|------|
| SA  |     | SA  |     | SA  |     | SA  |     |      |
| MCA | SWD | MCA | SWD | MCA | SWD | MCA | SWD | XDEC |
| SA  |     | SA  |     | SA  |     | SA  |     |      |
| MCA | SWD | MCA | SWD | MCA | SWD | MCA | SWD | XDEC |
| SA  |     | SA  |     | SA  |     | SA  |     |      |
| MCA | SWD | MCA | SWD | MCA | SWD | MCA | SWD | XDEC |
| SA  |     | SA  |     | SA  |     | SA  |     |      |
| MCA | SWD | MCA | SWD | MCA | SWD | MCA | SWD | XDEC |
| SA  |     | SA  |     | SA  |     | SA  |     |      |
| MCA | SWD | MCA | SWD | MCA | SWD | MCA | SWD | XDEC |
| SA  |     | SA  |     | SA  |     | SA  |     |      |
| MCA | SWD | MCA | SWD | MCA | SWD | MCA | SWD | XDEC |
| SA  |     | SA  |     | SA  |     | SA  |     |      |
| MCA | SWD | MCA | SWD | MCA | SWD | MCA | SWD | XDEC |
| SA  |     | SA  |     | SA  |     | SA  |     |      |
| YDEC | PT | YDEC | PT | YDEC | PT | YDEC | PT |   |
| DA  |     | DA  |     | DA  |     | DA  |     |      |

| MCA | SWD | MCA | SWD | MCA | SWD | MCA | SWD | XDEC |
|---|---|---|---|---|---|---|---|---|
| SA | | SA | | SA | | SA | | |
| MCA | SWD | MCA | SWD | MCA | SWD | MCA | SWD | XDEC |
| SA | | SA | | SA | | SA | | |
| MCA | SWD | MCA | SWD | MCA | SWD | MCA | SWD | XDEC |
| SA | | SA | | SA | | SA | | |
| MCA | SWD | MCA | SWD | MCA | SWD | MCA | SWD | XDEC |
| SA | | SA | | SA | | SA | | |
| | PT | | PT | | PT | | PT | |
| MCA | SWD | MCA | SWD | MCA | SWD | MCA | SWD | XDEC |
| SA | | SA | | SA | | SA | | |
| MCA | SWD | MCA | SWD | MCA | SWD | MCA | SWD | XDEC |
| SA | | SA | | SA | | SA | | |
| MCA | SWD | MCA | SWD | MCA | SWD | MCA | SWD | XDEC |
| SA | | SA | | SA | | SA | | |
| MCA | SWD | MCA | SWD | MCA | SWD | MCA | SWD | XDEC |
| SA | | SA | | SA | | SA | | |
| YDEC | | YDEC | | YDEC | | YDEC | | |
| DA | | DA | | DA | | DA | | |

| MCA | SWD | MCA | SWD | MCA | SWD | MCA | SWD | XDEC |
|---|---|---|---|---|---|---|---|---|
| SA | | SA | | SA | | SA | | |
| MCA | SWD | MCA | SWD | MCA | SWD | MCA | SWD | XDEC |
| SA | | SA | | SA | | SA | | |
| MCA | SWD | MCA | SWD | MCA | SWD | MCA | SWD | XDEC |
| SA | | SA | | SA | | SA | | |
| MCA | SWD | MCA | SWD | MCA | SWD | MCA | SWD | XDEC |
| SA | | SA | | SA | | SA | | |
| YDEC | PT | YDEC | PT | YDEC | PT | YDEC | PT | |
| MCA | SWD | MCA | SWD | MCA | SWD | MCA | SWD | XDEC |
| SA | | SA | | SA | | SA | | |
| MCA | SWD | MCA | SWD | MCA | SWD | MCA | SWD | XDEC |
| SA | | SA | | SA | | SA | | |
| MCA | SWD | MCA | SWD | MCA | SWD | MCA | SWD | XDEC |
| SA | | SA | | SA | | SA | | |
| MCA | SWD | MCA | SWD | MCA | SWD | MCA | SWD | XDEC |
| SA | | SA | | SA | | SA | | |
| DA | | DA | | DA | | DA | | |

| MCA | SWD | MCA | SWD | MCA | SWD | MCA | SWD | XDEC |
|-----|-----|-----|-----|-----|-----|-----|-----|------|
| SA  |     | SA  |     | SA  |     | SA  |     |      |
| MCA | SWD | MCA | SWD | MCA | SWD | MCA | SWD | XDEC |
| SA  |     | SA  |     | SA  |     | SA  |     |      |
| MCA | SWD | MCA | SWD | MCA | SWD | MCA | SWD | XDEC |
| SA  |     | SA  |     | SA  |     | SA  |     |      |
| MCA | SWD | MCA | SWD | MCA | SWD | MCA | SWD | XDEC |
| SA  |     | SA  |     | SA  |     | SA  |     |      |
| YDEC | PT | YDEC | PT | YDEC | PT | YDEC | PT |   |
| YDEC |    | YDEC |    | YDEC |    | YDEC |    |   |
| SA  |     | SA  |     | SA  |     | SA  |     |      |
|     | SWD |     | SWD |     | SWD |     | SWD | XDEC |
| SA  |     | SA  |     | SA  |     | SA  |     |      |
|     | SWD |     | SWD |     | SWD |     | SWD | XDEC |
| SA  |     | SA  |     | SA  |     | SA  |     |      |
|     | SWD |     | SWD |     | SWD |     | SWD | XDEC |
| SA  |     | SA  |     | SA  |     | SA  |     |      |
|     | SWD |     | SWD |     | SWD |     | SWD | XDEC |
|     | DA  |     | DA  |     | DA  |     | DA  |      |

| MCA | SWD | MCA | SWD | MCA | SWD | MCA | SWD | XDEC |
|---|---|---|---|---|---|---|---|---|
| SA | PT | SA | PT | SA | PT | SA | PT | |
| MCA | SWD | MCA | SWD | MCA | SWD | MCA | SWD | XDEC |
| SA | PT | SA | PT | SA | PT | SA | PT | |
| MCA | SWD | MCA | SWD | MCA | SWD | MCA | SWD | XDEC |
| SA | PT | SA | PT | SA | PT | SA | PT | |
| MCA | SWD | MCA | SWD | MCA | SWD | MCA | SWD | XDEC |
| SA | PT | SA | PT | SA | PT | SA | PT | |
| MCA | SWD | MCA | SWD | MCA | SWD | MCA | SWD | XDEC |
| SA | PT | SA | PT | SA | PT | SA | PT | |
| MCA | SWD | MCA | SWD | MCA | SWD | MCA | SWD | XDEC |
| SA | PT | SA | PT | SA | PT | SA | PT | |
| MCA | SWD | MCA | SWD | MCA | SWD | MCA | SWD | XDEC |
| SA | PT | SA | PT | SA | PT | SA | PT | |
| YDEC | | YDEC | | YDEC | | YDEC | | |
| DA | | DA | | DA | | DA | | |

SEMICONDUCTOR MEMORY DEVICE CAPABLE OF IMPROVING READ OPERATION SPEED

BACKGROUND OF THE INVENTION

1. Field of the Invention

The present invention relates to a semiconductor memory device, and more particularly, to an improvement of the read operation speed of a dynamic random access memory (DRAM) device.

2. Description of the Related Art

In a prior art semiconductor memory device including a plurality of sense amplifiers arranged in rows, columns, a plurality of local data input/output line pairs, each pair being connected to one row of the sense amplifiers, a global data input/output line pair, and a plurality of switches each connected between one of the local data input/output line pairs and the global data input/output line pair, a pull-up circuit and a differential amplifier are connected to the global data input/output line pair. In this case, the pull-up circuit is provided near the differential amplifier. This will be explained later in detail.

In the above-described prior art semiconductor memory device, however, the pull-up circuit is provided near the differential amplifier, the amount of signals supplied to the differential amplifier is so small that the read operation speed is decreased. This also will be explained later in detail.

SUMMARY OF THE INVENTION

It is an object of the present invention to improve the read operation speed of a semiconductor memory device.

According to the present invention, in a semiconductor memory device including a plurality of sense amplifiers arranged in rows, columns, a plurality of local data input/output line pairs, each pair being connected to one row of the sense amplifiers, a global data input/output line pair, a plurality of switches each connected between one of the local data input/output line pairs and the global data input/output line pair, and a differential amplifier connected to the global data input/output line pair, at least one pull-up circuit is connected to the global data input/output line pair. At least one of the switches is connected to the global data input/output line pair between the pull-up circuit and the differential amplifier. For example, the pull-up circuit is provided at an intermediate portion of the global data input/output line pair.

Also, in a semiconductor memory device including a plurality of sense amplifiers arranged in rows, columns, a plurality of local data input/output line pairs, each pair being connected to one row of the sense amplifiers, a global data input/output line pair, a plurality of switches each connected between one of the local data input/output line pairs and the global data input/output line pair, and a differential amplifier connected to the global data input/output line pair, one pull-up circuit is connected to each of the local data input/output line pairs.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, a prior art semiconductor memory device will be explained with reference to FIGS. 1, 2, 3, 4A, 4B and 4C.

Figure 1:
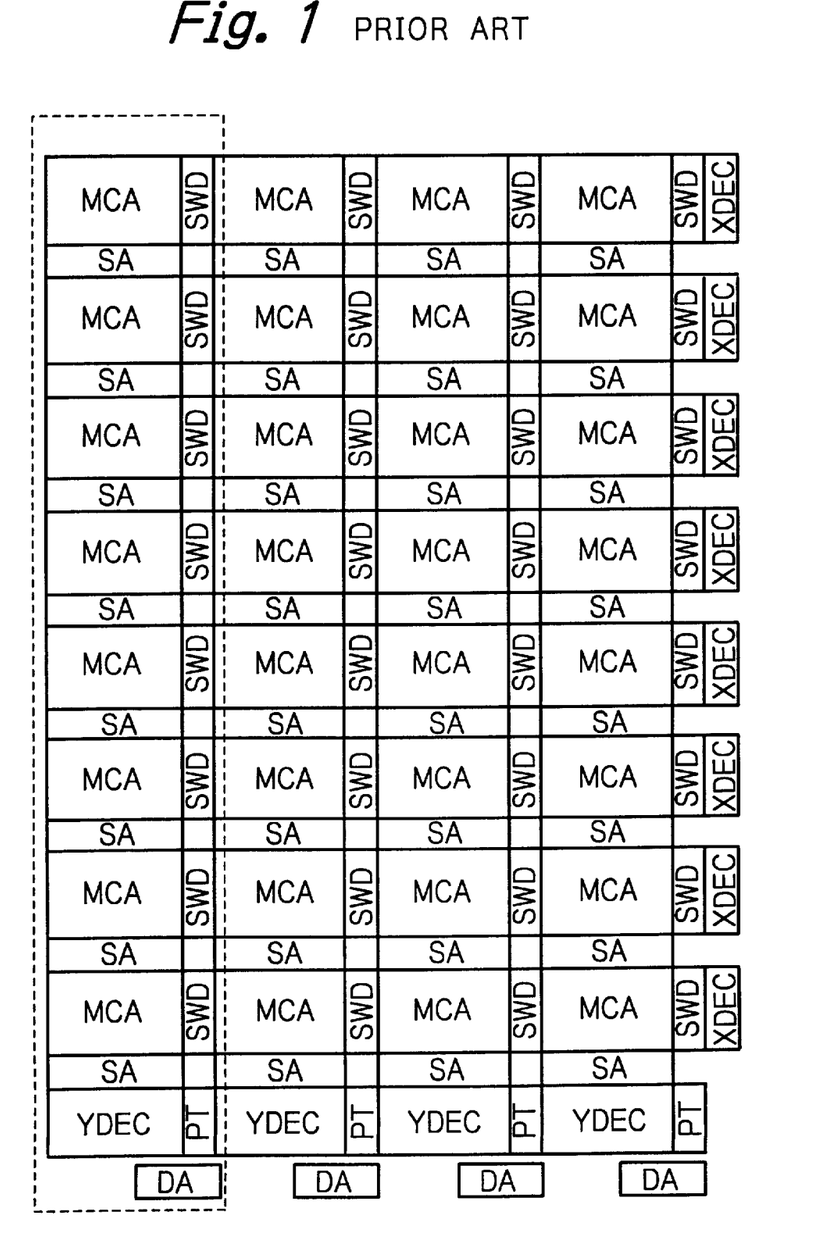
FIG. 1 is a layout diagram illustrating a prior art semiconductor memory device.

In FIG. 1, which is a layout diagram illustrating a prior art semiconductor memory device, memory cell array areas MCA are arranged in rows, columns. One sense amplifier area SA and one sub word line drive circuit area SWD are provided for each of the memory cell arrays MCA. Also, one row decoder area XDEC is provided for each row of the memory cell arrays MCA. On the other hand, one column decoder area YDEC, one pull-up transistor area PT and one differential amplifier area DA are provided for each column of the memory cell arrays MCA.

Figure 2:
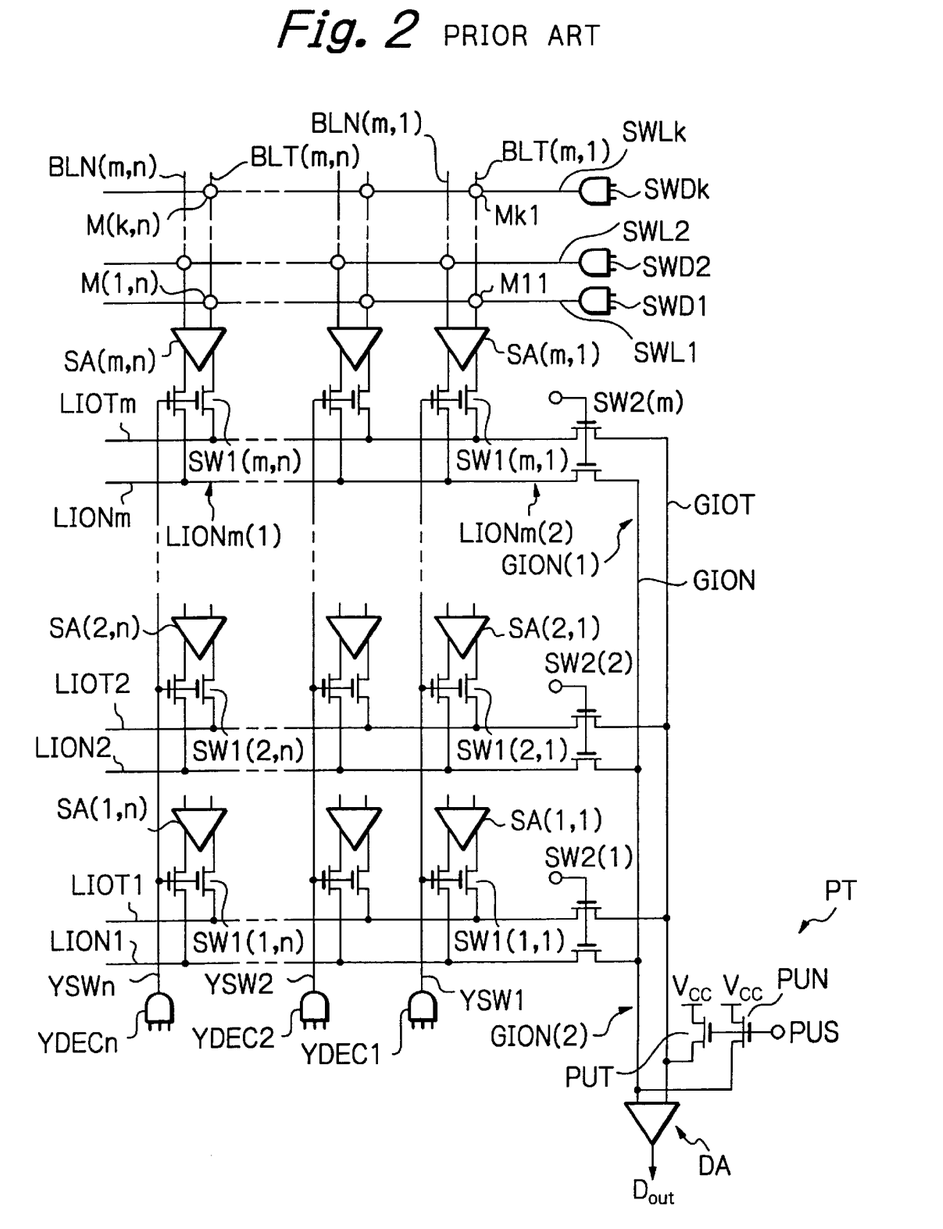
FIG. 2 is a partial circuit diagram of the device of FIG. 1.

In FIG. 2, which is a detailed circuit diagram of a portion surrounded by a dotted line in FIG. 1, sense amplifiers SAij (i=1, 2, . . . , m; j=1, 2, . . . , n) are arranged in m rows, n columns to form the sense amplifier areas SA surrounded by the dotted Line in FIG. 1.

A plurality of complementary bit lines are connected to each row of the sense amplifiers. For example, complementary bit lines BLT (m, n) and BLN (m, n) are connected to the sense amplifier SA (m, n) for amplifying the difference in potential therebetween. On the other hand, sub word line drive circuits SWD1, SWD2, . . . , SWDk are provided in each of the sub word line drive circuit areas SWD of FIG. 1, and are connected to sub word lines SWL1, SWL2, . . . , SWLk, respectively. Also, row decoders are provided in the row decoder area XDEC of FIG. 1.

Provided at each intersection between the sub word lines SWD1, SWD2, . . . , SWDk and the bit line pairs BLT (m, 1), BLN (m, 1), . . . , BLT (m, n), BLN (m, n) is one memory cell of a one-transistor, one-capacitor type of the memory cell array MCA of FIG. 1. For example, a memory cell M (k, n) is connected at the intersection between the sub word line SWDk and the bit line BLT (m, n).

Note that sub word lines connected to sub word line drive circuits, bit lines, and memory cells connected between the sub word lines and the bit lines (not shown) are provided for other rows of the sense amplifiers.

The bit lines connected to each row of the sense amplifiers are further connected by switches each formed by two N-channel MOS transistors to a pair of local data input/ output lines. For example, the bit lines BLT (m, n) and BLN (m, n) are connected by the switch SW1 (m, n) to the local data input/output lines LIOTm and LIONm, respectively.

Y decoders YDEC1, YDEC2, . . . , YDECn are provided in the column decoder area YDEC of FIG. 1, and are connected to Y selection lines YSW1, YSW2, . . . , YSWn, respectively. One column of the switches SW1 (1, j), SW1 (2, j), . . . , SW1 (m, j) are connected to each of the Y selection lines YSW1, YSW2, . . . , YSWj, respectively. Thus, the switch SW1 (i, j) is turned ON and OFF by the Y decoder YDECj.

The local data input/output lines LIOTi and LIONi (i=1, 2, . . . , m) are connected by a switch SW2 (i) formed by two N-channel MOS transistors lo global data input/output lines GIOT and GION, respectively. Thus, only one pair of the local data input/output lines LIOTi and LIONi are selected by the switches SW2 (1), SW2 (2), . . . , SW2 (m) and are connected to the global data input/output lines GIOT and GION.

Pull-up transistors, PUT and PUN, which are in this case N-channel MOS transistors, are provided in the pull-up transistor area PT of FIG. 1, and are connected between the global data input/output lines GIOT and GION and a power supply terminal whose voltage is $V_{CC}$. The pull-up transistors PUT and PUN are turned ON and OFF by a pull-up signal PUS.

A differential amplifier is provided in the differential amplifier area DA of FIG. 1, and is connected to the global data input/output lines GIOT and GION, so as to generate an output voltage $V_{out}$ in accordance with the difference in potential between the global data input/output lines GIOT and GION.

Figure 3:
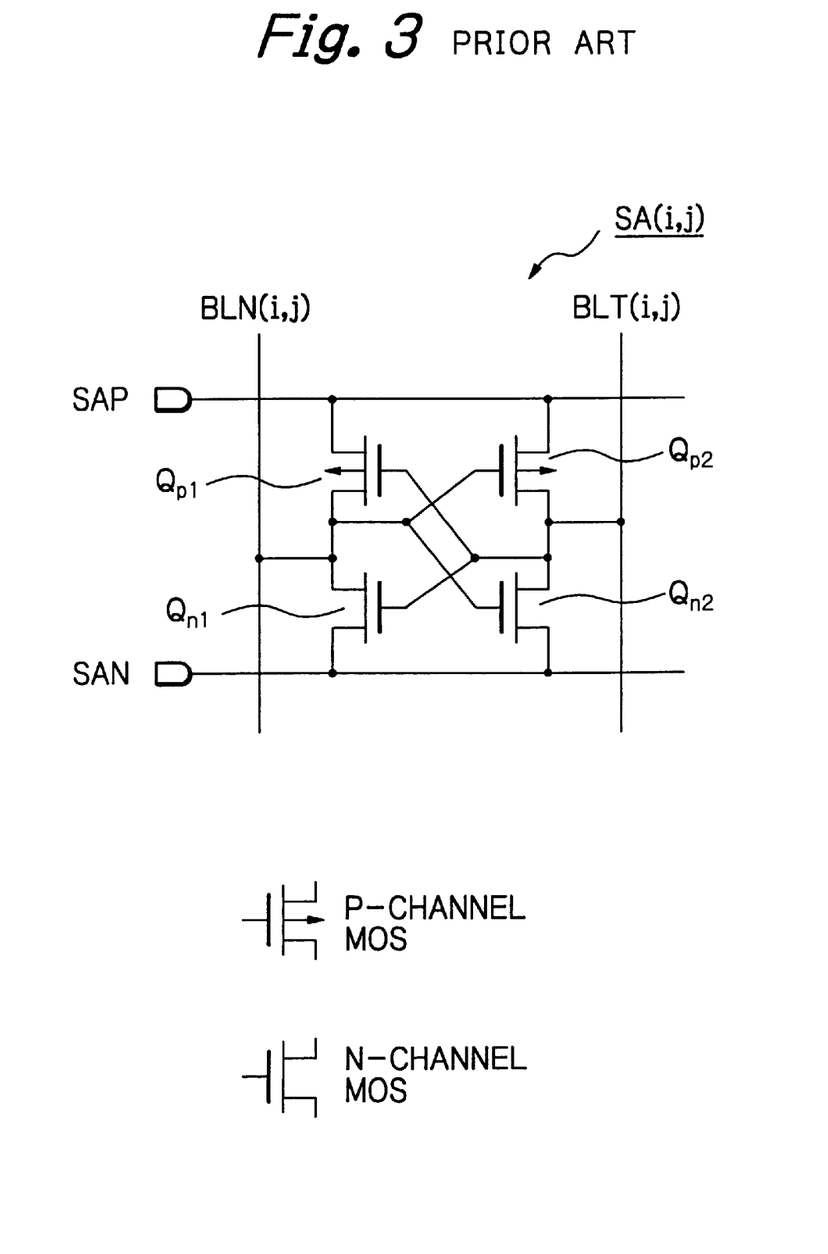
FIG. 3 is a circuit diagram of the sense amplifier of the device of FIG. 2.

In FIG. 3, which is a circuit diagram of the sense amplifier SA (i, j) of FIG. 2, the sense amplifier SA (i, j) is constructed by a flip-flop formed by two cross-coupled P-channel MOS transistors $Q_{p1}$ and $Q_{p2}$ and two cross-coupled N-channel MOS transistors $Q_{n1}$ and $Q_{n2}$ connected between the bit lines BLT (i, j) and BLN (i, j). The P-channel MOS transistors $Q_{p1}$ and $Q_{p2}$ are controlled by a sense amplifier enable signal SAP, and the N-channel MOS transistors $Q_{n1}$ and $Q_{n2}$ are controlled by a sense amplifier enable signal SAN.

The operation of the device of FIG. 2 will be explained next with reference to FIGS. 4A, 4B and 4C, where data is read from the memory cell M (1, n). In a stand-by mode, all the bit lines such as BLT (m, n) and BLN (m, n), the lines of the sense amplifier enable signals SAP and SAN, the local data input/output lines LIOT1, LION1, . . . , LIOTm, LIONm, and the global data input/output line GIOT and GION are precharged at $V_{CC}/2$ by a precharging circuit (not shown).

First, at time t1, the row decoder provided in the row decoder area XDEC is operated to select the sub word line drive circuit SWD1, thus entering a selecting mode. As a result, the voltage at the sub word line SWLT is made higher than $V_{CC}$ as shown in FIG. 4A.

When the voltage at the sub word line SWL1 is made higher, the transistor of the memory cell M (1, n) is completely turned ON, so that the charge stored in the capacitor of the memory cell M (1, n) is divided between this capacitor and the bit line BLT (m, n). As a result, a voltage difference $\Delta V1$ as shown in FIG. 4B is generated between the bit lines BLT (m, n) and BLN (m, n). In this case, since a capacitance ratio of the capacitor of the memory cell M (1, n) to the bit line BLT (m, n) is very small, the difference $\Delta V1$ is very small.

Figure 4A:
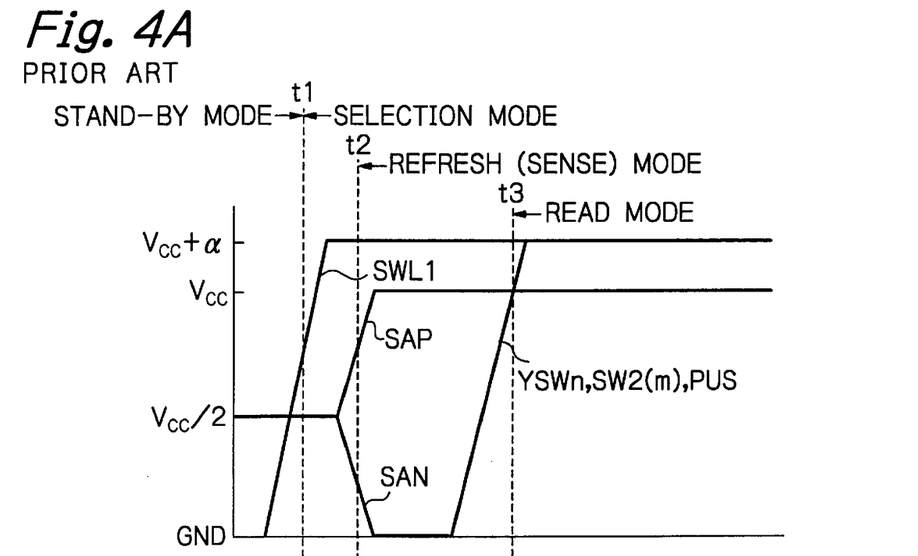
FIGS. 4A, 4B and 4C are timing diagrams showing the operation of the device of FIG. 2.

Next, at time t2, the voltages at the sense amplifier enable signals SAP and SAN are made VCC and GND, respectively, as shown in FIG. 4A, thus entering a refresh mode. That is, the sense amplifier SA (m, n) as well as the other sense amplifiers are operated. As a result, the voltage at the bit line BLT (m, n) on a higher voltage side becomes $V_{CC}$ and the voltage at the bit line BLN (m, n) on a lower voltage side becomes GND, thus carrying out a sense operation as well as a refresh operation.

Finally, at time t3, the Y decoder YDECn is operated to select the Y selection line YSWn. As a result, the voltage at the Y selection line YSWn is made higher than $V_{CC}$ as shown in FIG. 4A. Simultaneously, as shown in FIG. 4A, the control voltage at the switch SW2 (m) is made higher than $V_{CC}$, and also, the pull-up signal PUS is made higher than $V_{CC}$.

When the voltage at the Y selection line YSWn is made higher, the N-channel MOS transistors of the switch SW1 (m, n) are completely turned ON, so that the bit lines BLT (m, n) and BLN (m, n) are electrically connected to the local data input/output lines LIOTm and LIONm, respectively. Also, the control voltage at the switch SW2 (m) is made higher, the switch SW2 (m) is completely turned ON, so that the local data input/output lines LIOTm and LIONm are electrically connected to the global data input/output lines GIOT and GION, respectively. Further, when the pull-up signal PUS is made higher than $V_{CC}$, the pull-up transistors PUT and PUN are completely turned ON, so that the voltages at the global data input/output lines GIOT and GION are pulled up. Thus, the control enters a read mode.

In the read mode, note that the other switches SW1 (1, n), SW1 (2, n), . . . , SW1 (m–1, n) are also turned ON by the Y selection signal YSWn; however, the voltages at the other local data input/output lines LIOT1, LION1, LIOT2, LION2, . . . , LIOTm–1, LIONm–1 do not affect the voltages at the global data input/output lines GIOT and GION, since the other switches SW2 (1), SW2 (2), . . . , SW2 (m–1) are turned OFF.

Figure 4B:
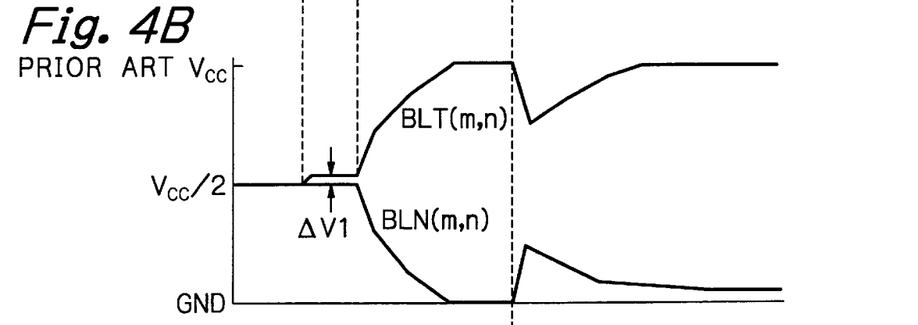
Figure 4C:
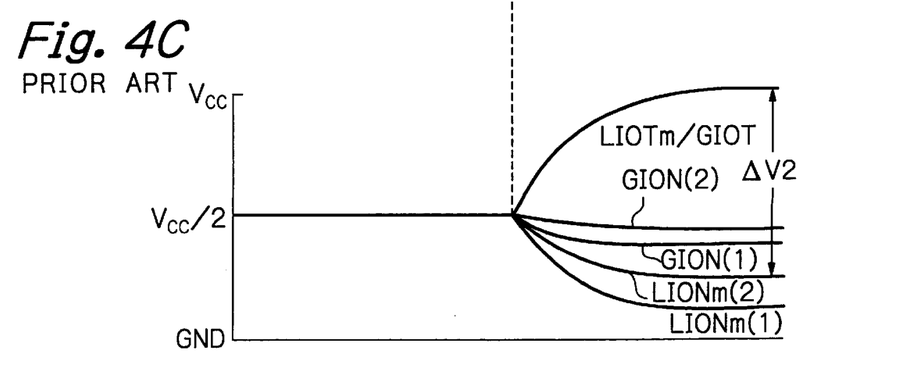

In the read mode, as shown in FIG. 4C, the local data input/output line LIOTm and the global data input/output line GIOT are pulled up by the sense amplifier SA (m, n) and the pull-up transistor PUT to $V_{CC}$, since there is no pull-down path therein. In this case, as shown in FIG. 4B, the bit line BLT (m, n) temporarily becomes a slightly lower; however, the bit line BLT (m, n) is charged by the sense amplifier SA (m, n) to return to $V_{CC}$.

On the other hand, as shown in FIG. 4C, the local data input/output line LIONm and the global data input/output line GION are pulled down by the sense amplifier SA (m, n) and are pulled up by the pull-up transistor PUN. Even in this case, as shown in FIG. 4B, the bit line BLN (m, n) temporarily becomes a slightly higher; however, the bit line BLN (m, n) is discharged by the sense amplifier SA (m, n) to return to GND. As a result, as shown in FIG. 4C, the voltages at the local data input/output line LION and the global data input/output line GION become intermediate levels between $V_{CC}$ and GND.

In FIG. 4C, note that LION (1) indicates the voltage of the local data input/output line LION near the sense amplifier SA (m, n), and LION (2) indicates the voltage of the local data input/output line LION near the switch SW2 (m)). Also, GION (1) indicates the voltage of the global data input/ output line GION near the switch SW2 (m), and GION (2) indicates the voltage of the global data input/output line GION near the differential amplifier area DA.

In the device of FIG. 2, however, the pull-up transistor area PT is provided near the differential amplifier area DA, the amount of signals supplied to the differential amplifier area DA is so small that the read operation speed is decreased. That is, the amount of signals supplied to the differential amplifier area DA is determined by the ratio between the resistance of a path from the sense amIplifier such as SA (m, n) to the differential amplifier area DA and an ON-resistance of the pull-up transistor PUT or PUN. In more detail, the resistance of this path is a sum of the ON-resistance of the N-channel MOS transistor of the sense amplifier SA (m, n), the ON-resistance of one N-channel MOS transistor of the switch such as SW1 (m, n), the resistance of the local data input/output line LIOT or LION, the ON-resistance of one N-channel MOS transistor of the switch such as SW2 (m), and the resistance of the global data input/output line GIOT or GION. Therefore, the voltage GION (2) of the global data input/output line GION cannot be decreased so that a voltage difference $\Delta V2$ between the global data input/output line GIOT and GION immediately before the differential amplifier area DA is small, which decreases the read operation speed. At worst, it is impossible to carry out a read operation.

In FIG. 2, when reading data from the sense amplifiers other than the sense amplifier SA (m, n), the read operation speed is also decreased.

Particularly, in a large scale semiconductor memory device where the local data input/output lines such as LIOT1, and LION1 and the global data input/output line GIOT and GION are both very long, the resistance of the above-mentioned path becomes large, which further decreases the read operation speed.

Note that it is possible to shorten the local data input/ output lines such as LIOT1 and LION1 by decreasing the number of sense amplifiers connected to one local data input/output line pair; however, in this case, it is impossible to shorten the global data input-output lines GIOT and GION when the memory cell array areas MCA are definite in size and the differential amplifier area DA is located at ends thereof. Thus, the read operation speed can not be increased.

Also, it is possible to increase the amount of signals supplied to the differential amplifier area DA by decreasing the ability of the pull-up transistors PUT and PUN while the resistance of the above-mentioned path is maintained; however, the speed of raising the local data input/output line and the global data input/output line on a higher voltage side is decreased, which also decreases the read operation speed.

Figure 5:
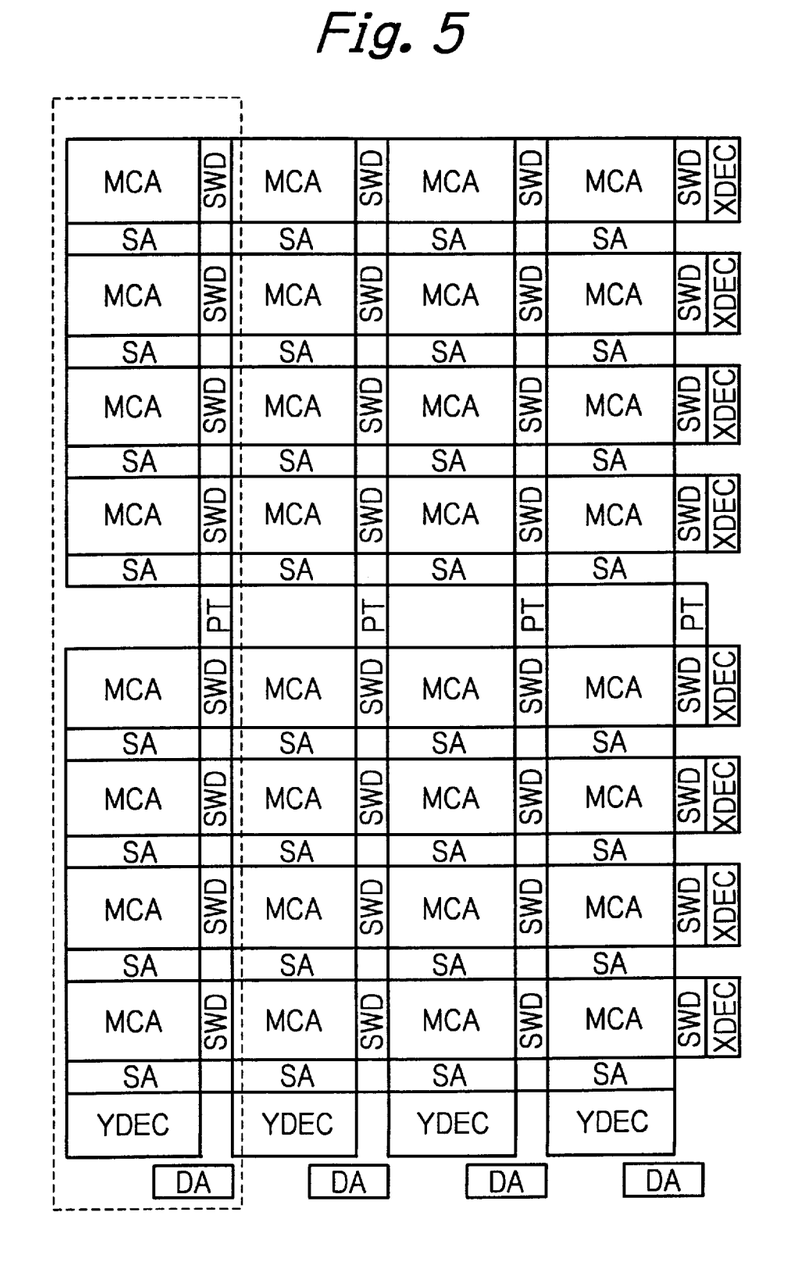
FIG. 5 is a layout diagram illustrating a first embodiment of the semiconductor memory device according to the present invention.

In FIG. 5, which illustrates a first embodiment of the present invention, the pull-up transistor area PT is provided at an intermediate portion of each column of the memory cell arrays MCA. That is, as illustrated in FIG. 6, which is a detailed circuit diagram of a portion surrounded by a dotted line in FIG. 5, the pull-up transistors PUT and PUN are connected to the global data input/output lines GIOT and GION between the local data input/output lines LIOTm/2 and LIONm/2 and the local data input/output lines LIOTm/ 2+1 and LIONm/2+1.

Figure 6:
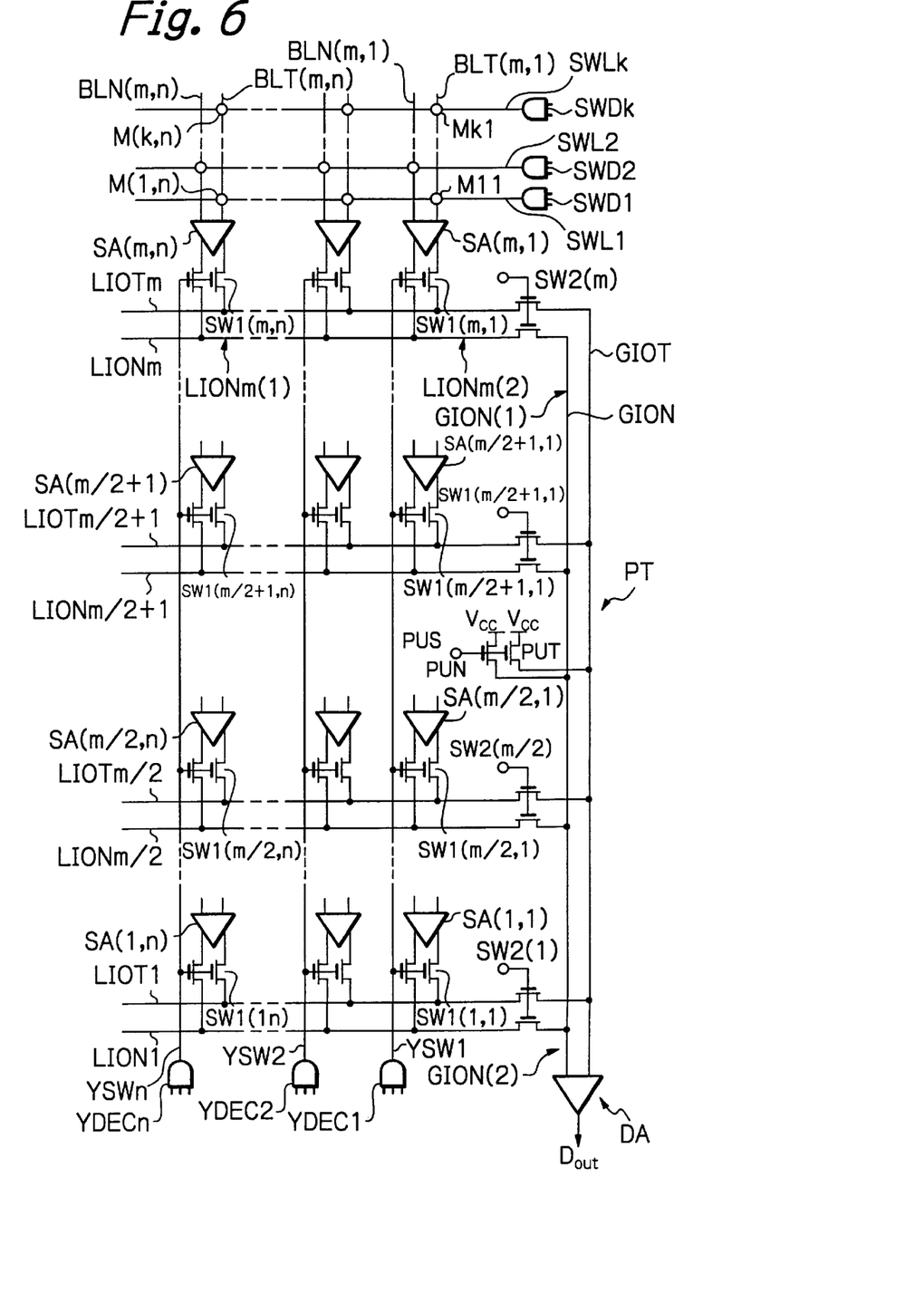
FIG. 6 is a partial circuit diagram of the device of FIG. 5.
Figure 7A:
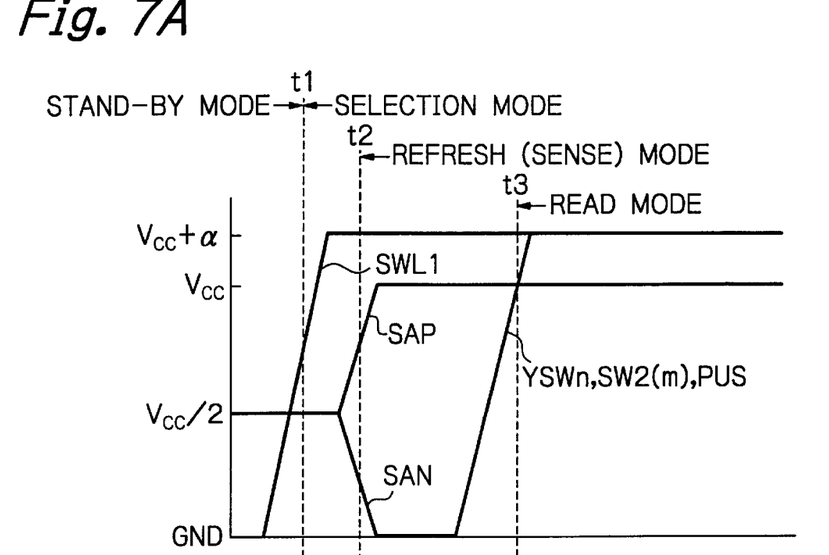
FIGS. 7A, 7B and 7C are timing diagrams showing the operation of the device of FIG. 6.
Figure 7B:
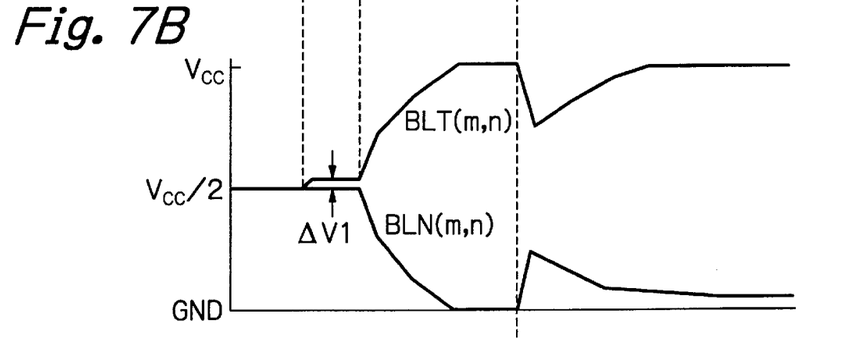
Figure 7C:
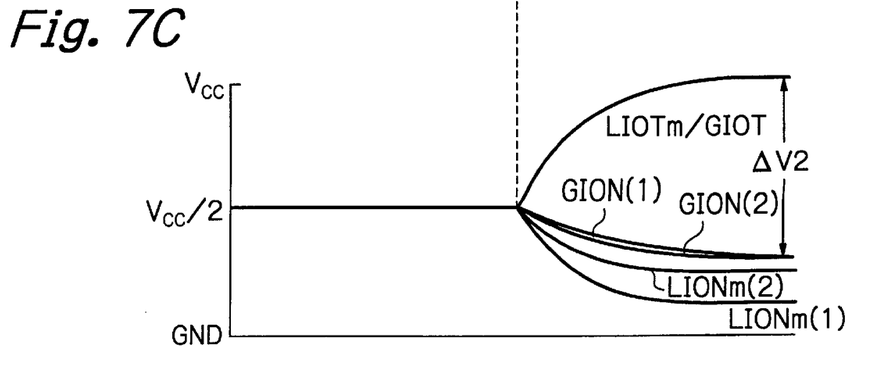

The operation of the device of FIG. 6 is shown in FIGS. 7A, 7B and 7C which are similar to FIGS. 4A, 4B and 4C, respectively.

In the device of FIG. 6, the pull-up transistor area PT is provided at the intermediate portion of the global data input/output lines GIOT and GION, the amount of signals supplied to the differential amplifier area DA is so large that the read operation speed is decreased. That is, the amount of signals supplied to the differential amplifier area DA is determined by the ratio between the resistance of a path from the sense amplifier such as SA (m, n) to the switch such as SW2 (m) and the resistance of a path from the pull-up transistor PUT or PUN to the switch such as SW2 (m). Therefore, the voltage GION (2) of the global data input/ output line GION can be decreased so that a voltage difference $\Delta V2$ between the global data input/output line GIOT and GION immediately before the differential amplifier area DA is relatively large, which increases the read operation speed.

In FIG. 6, when reading data from the other sense amplifiers than the sense amplifier SA (m, n), the read operation speed is also increased.

Even in a large scale semiconductor memory device where the local data input/output lines such as LIOT1, and LION1 and the global data input/output line GIOT and GION are both very long, the resistance of the above-mentioned paths becomes relatively small, which would increase the read operation speed, since the amount of signals supplied to the differential amplifier area DA is slightly dependent upon the length of the global data input/ output lines GIOT and GION.

Figure 8:
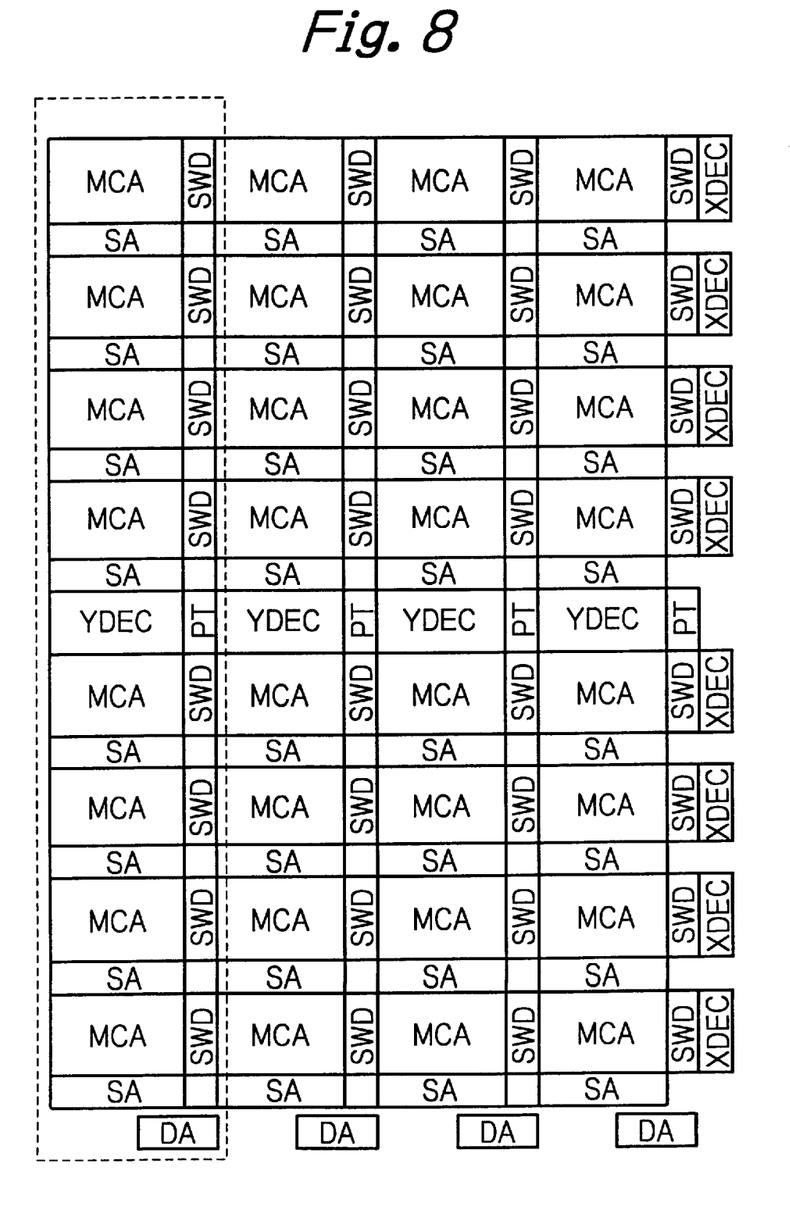
FIG. 8 is a layout diagram illustrating a first modification of the device of FIG. 5.
Figure 9:
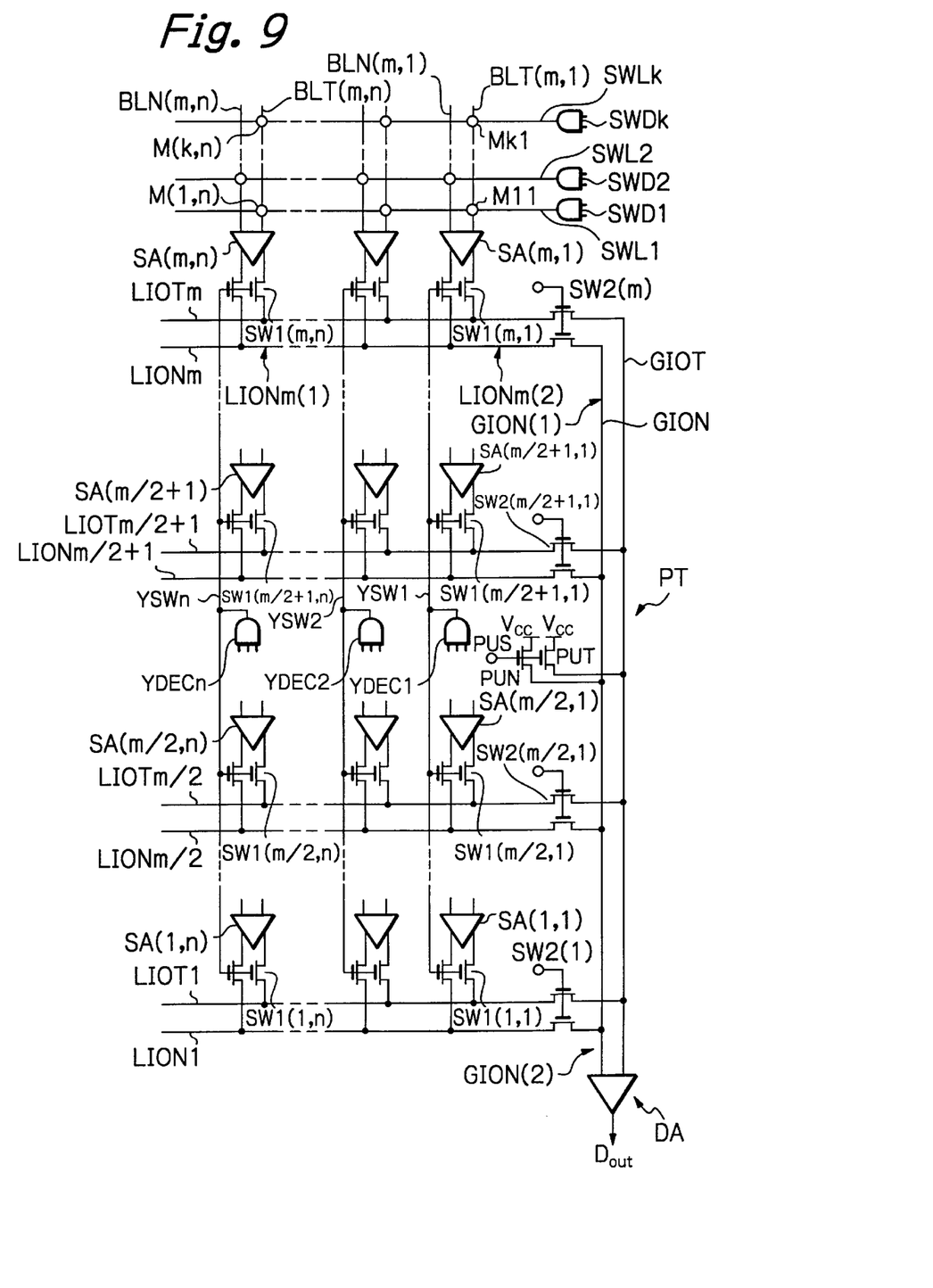
FIG. 9 is a partial circuit diagram of the device of FIG. 8.

In FIG. 8, which illustrates a first modification of the device of FIG. 5, the column decoder area YDEC is also provided at an intermediate portion of each column of the memory cell arrays MCA adjacent to the pull-up transistor area PT, thus improving the integration. That is, as illustrated in FIG. 9, which is a detailed circuit diagram of a portion surrounded by a dotted line in FIG. 8, the Y decoders YDEC1, YDEC2, . . . , YDECn are provided adjacent to the pull-up transistors PUT and PUN.

Figure 10:
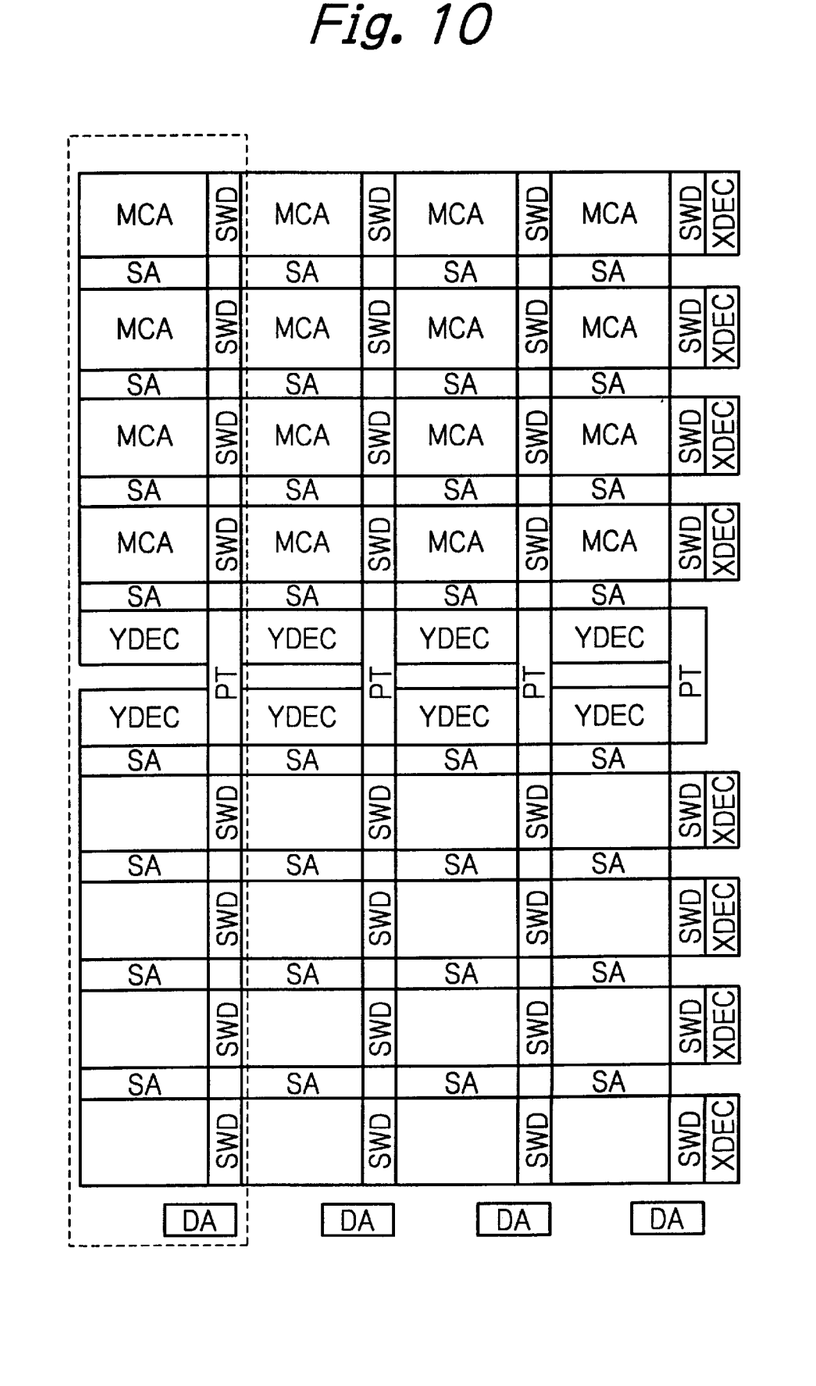
FIG. 10 is a layout diagram illustrating a first modification of the device of FIG. 5.
Figure 11:
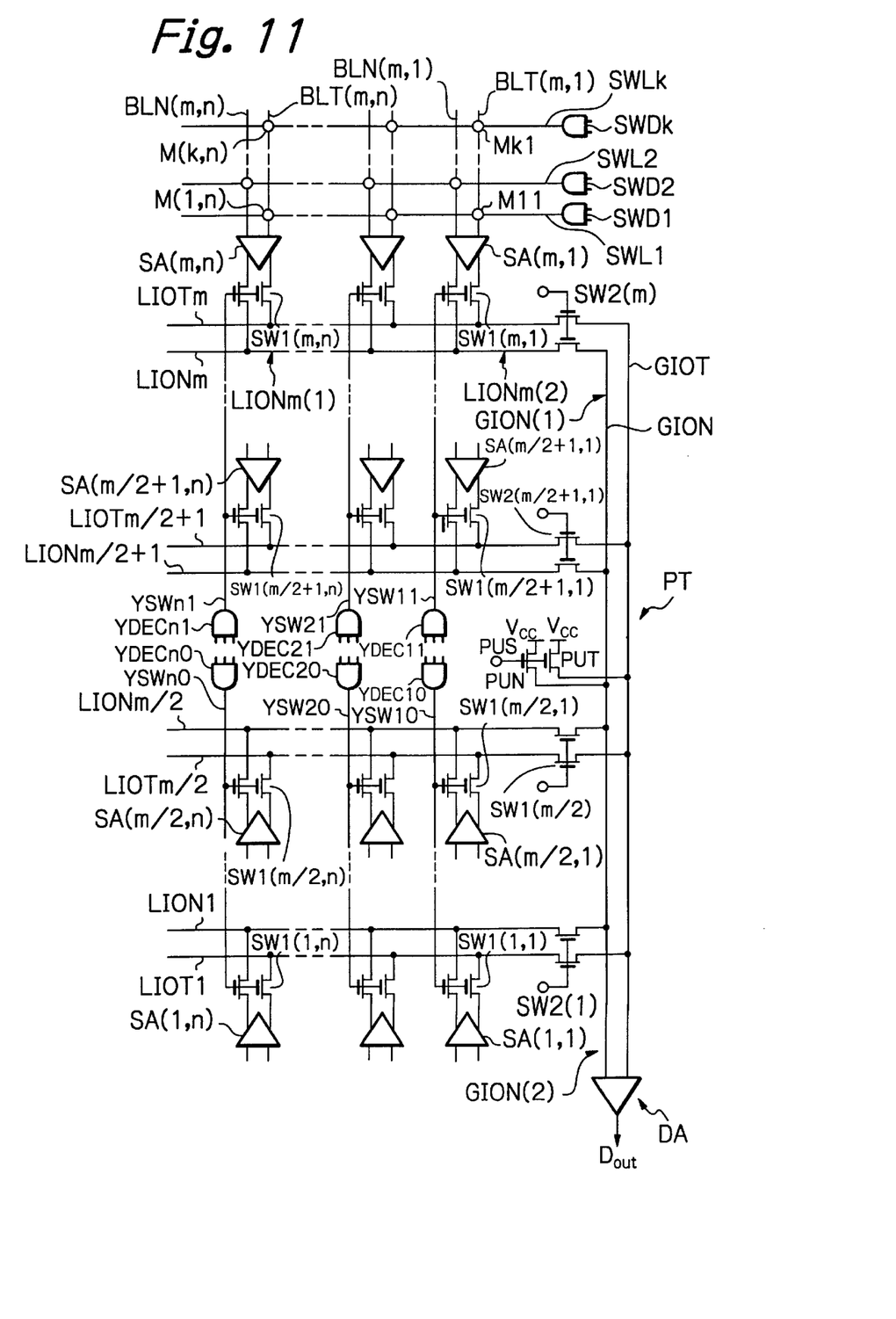
FIG. 11 is a partial circuit diagram of the device of FIG. 10.

In FIG. 10, which illustrates a second modification of the device of FIG. 5, two column decoder areas YDEC are provided at an intermediate portion of each column of the memory cell arrays MCA adjacent to the pull-up transistor area PT, thus improving the integration. That is, as illustrated in FIG. 11, which is a detailed circuit diagram of a portion surrounded by a dotted line in FIG. 10, Y decoders YDEC10, YDEC20, . . . , YDECn0 are provided adjacent to the pull-up transistors PUT and PUN, and are connected to Y selection lines YSW10, YSW20, . . . , YSWn0, respectively, of a lower portion of the memory cell arrays MCA. Similarly, Y decoders YDEC11, YDEC21, . . . , YDECN1 are provided adjacent to the pull-up transistors PUT and PUN, and are connected to Y selection lines YSW11, YSW21, . . . , YSWn1, respectively, of an upper portion of the memory cell arrays MCA. Thus, two memory cells of the memory cell arrays, MCA can be successively read to further improve the read operation speed as compared with the device of FIGS. 8 and 9.

In the above-described embodiment as illustrated in FIGS. 5, 6, 8, 9, 10 and 11, only one pull-up transistor area PT is provided in each global data input/output line pair; however, two or more pull-up transistor areas PT can be provided in each global data input/output line pair.

Figure 12:
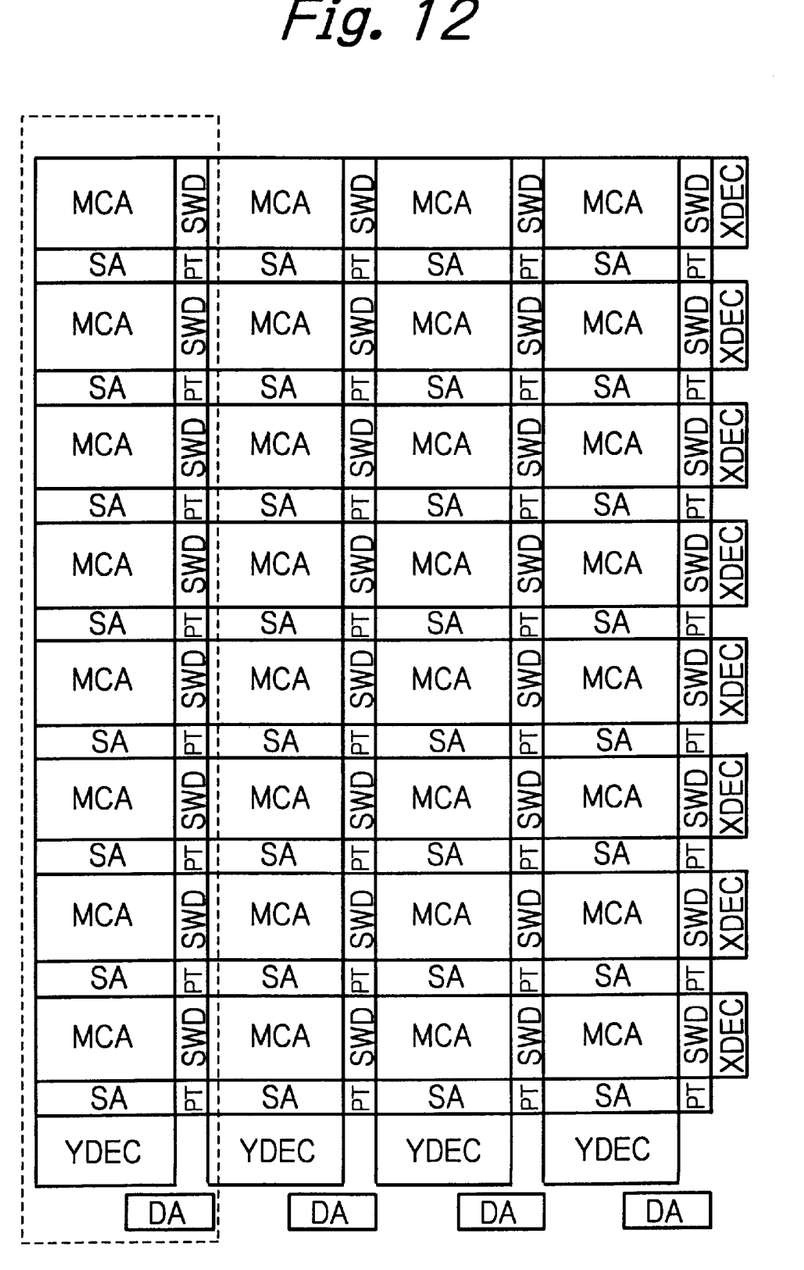
FIG. 12 is a layout diagram illustrating a first embodiment of the semiconductor memory device according to the present invention.
Figure 13:
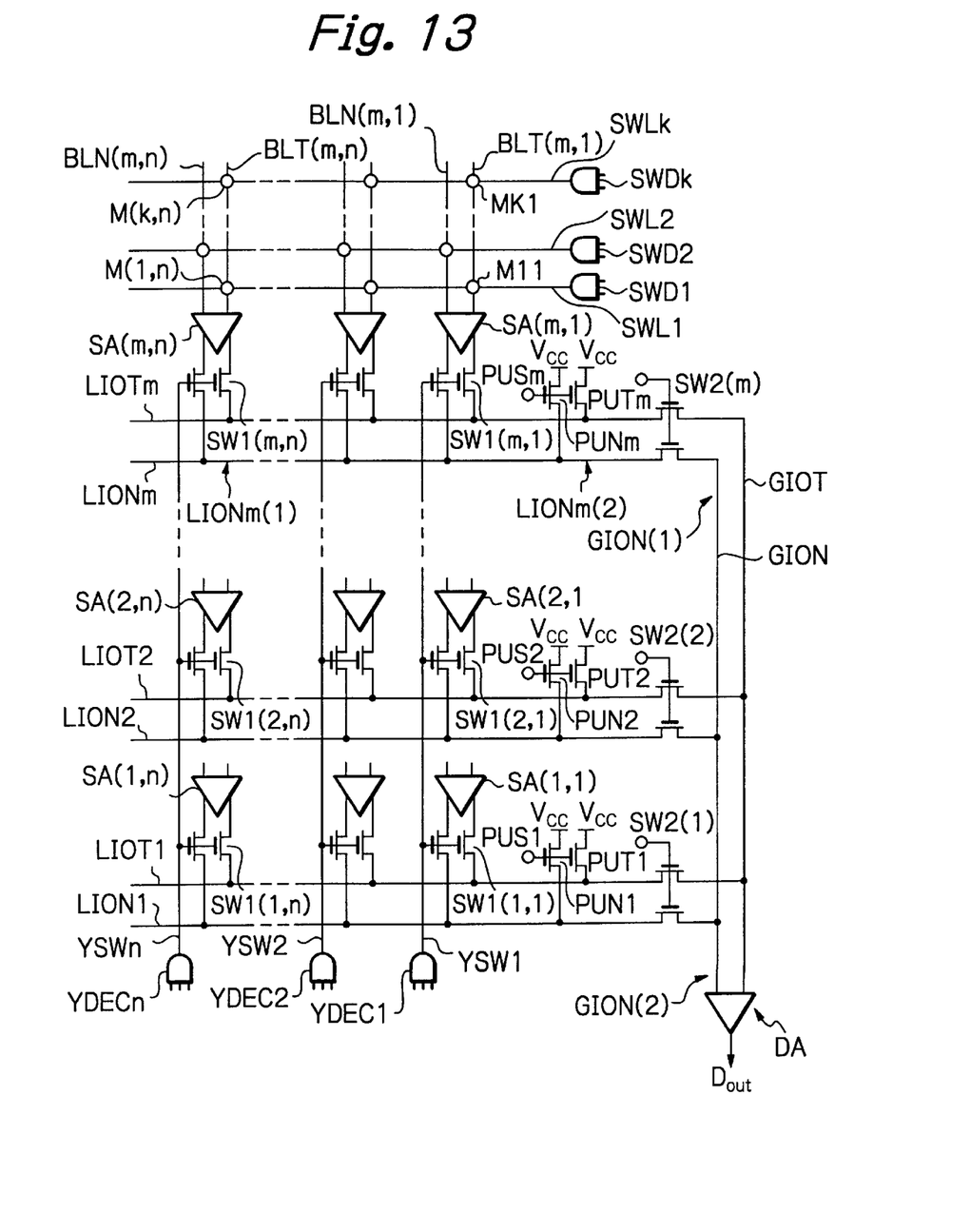
FIG. 13 is a partial circuit diagram of the device of FIG. 12.

In FIG. 12, which illustrates a first embodiment of the present invention, one pull-up transistor area PT is provided adjacent to each of the sense amplifier area SA. That is, as illustrated in FIG. 13, which is a detailed circuit diagram of a portion surrounded by a dotted line in FIG. 12, pull-up transistors PUTi and PUNi (i=1, 2, . . . , m) are connected to the local data input/output lines LIOTi and LIONi, respectively. The pull-up transistors PUTi and PUNi are turned ON and OFF by a pull-up signal PUSi.

Figure 14A:
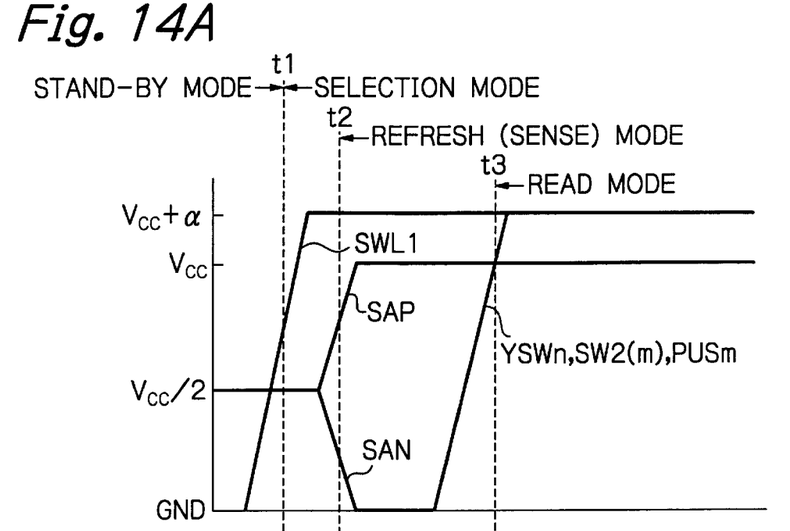
FIGS. 14A, 14B and 14C are timing diagrams showing the operation of the device of FIG. 13.
Figure 14B:
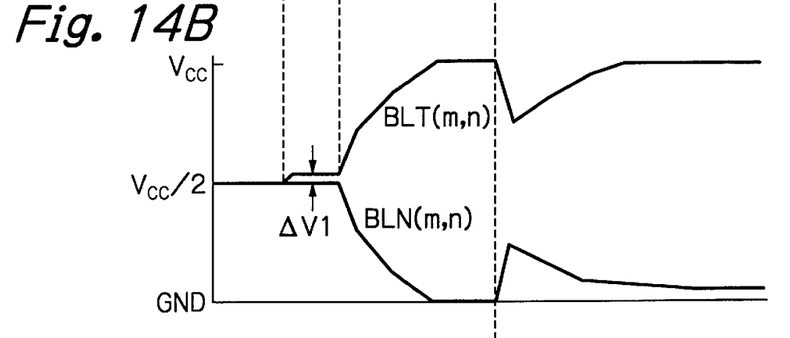
Figure 14C:
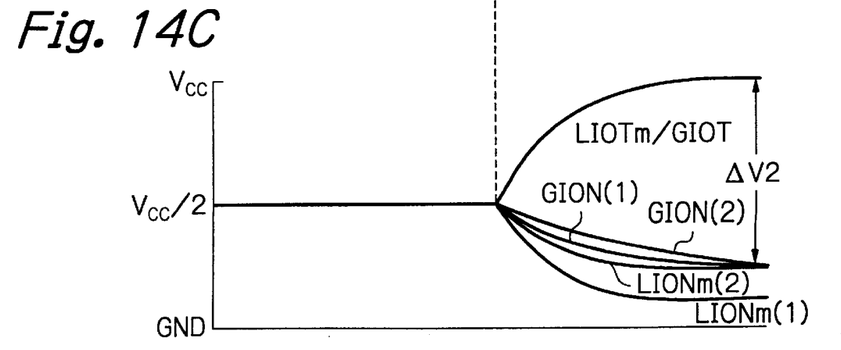

The operation of the device of FIG. 13 is shown in FIGS. 14A, 14B and 14C which are similar to FIGS. 4A, 4B and 4C, respectively.

In the device of FIG. 13, the pull-up transistor area PT is provided at each of the local data input/output lines LIOTi and LIONi, the amount of signals supplied to the differential amplifier area DA is so large that the read operation speed is decreased. That is, the amount of signals supplied to the differential amplifier area DA is determined by the ratio between the resistance of a path from the sense amplifier such as SA (m, n) to the switch such as SW2 (m) and the resistance of a path from the pull-up transistor PUT or PUN to the switch such as SW2 (m). Therefore, the voltage GION (2) of the global data input/output line GION can be decreased so that a voltage difference ΔV2 between the global data input/output line GIOT and GION immediately before the differential amplifier area DA is relatively large, which increases the read operation speed.

In FIG. 13, when reading data from the other sense amplifiers than the sense amplifier SA (m, n), the read operation speed is also increased.

Even in a Large scale semiconductor memory device where the local data input/output lines such as LIOT1, and LION1 and the global data input/output line GIOT and GION are both very long, the resistance of the above-mentioned paths becomes relatively small, which would increase the read operation speed, since the amount of signals supplied to the differential amplifier area DA is slightly dependent upon the length of the global data input/output lines GIOT and GION.

As explained hereinabove, according to the present invention, since one or two pull-up transistor areas are apart from a differential amplifier area DA, the amount of signals supplied thereto is slightly dependent upon the length of global data input/output lines, thus improving the read operation speed.

What is claimed is:

1. A semiconductor memory device comprising:
   a plurality of sense amplifiers arranged in rows, columns;
   a plurality of local data input/output line pairs, each pair being connected to one row of said sense amplifiers;
   a global data input/output line pair;
   a plurality of first switches each connected between one of said local data input/output line pairs and said global data input/output line pair;
   at least one pull-up circuit, connected to said global data input/output line pair, for pulling up voltages at said global data input/output line pair; and
   a differential amplifier, connected to said global data input/output line pair, for amplifying a difference between the voltages at said global data input/output line pair,
   at least one of said first switches being connected to said global data input/output line pair between said pull-up circuit and said differential amplifier.

2. The device as set forth in claim 1, wherein said pull-up circuit is connected at an intermediate portion of said global data input/output line pair.

3. The device as set forth in claim 1, further comprising:
   a plurality of second switches, each connected between one of said sense amplifiers and one of said local data input/output line pairs; and
   a plurality of decoders, each connected to one column of said second switches, for selecting one column of said sense amplifiers.

4. The device as set forth in claim 3, wherein said decoders are arranged adjacent to said differential amplifier.

5. The device as set forth in claim 3, wherein said decoders are arranged adjacent to said pull-up circuit.

6. The device as set forth in claim 1, further comprising:
   a plurality of second switches, each connected between one of said sense amplifiers and one of said local data input/output line pairs;
   a plurality of first decoders, each connected to one column of a first group of said second switches, for selecting one column of the first group of said sense amplifiers; and
   a plurality of second decoders, each connected to one column of a second group of said second switches, for selecting one column of the second group of said sense amplifiers.

7. The device as set forth in claim 6, wherein said first and second decoders are arranged adjacent to said pull-up circuit.

8. A semiconductor memory device comprising:
   a plurality of sense amplifiers arranged in rows, columns;
   a plurality of local data input/output line pairs, each pair being connected to one row of said sense amplifiers;
   a global data input/output line pair;
   a plurality of first switches each connected between one of said local data input/output line pairs and said global data input/output line pair;
   a plurality of pull-up circuits, each connected to one of said local data input/output line pairs, for pulling up voltages at the one of said local data input/output line pairs; and
   a differential amplifier, connected to said global data input/output line pair, for amplifying a difference between the voltages at said global data input/output line pair.

9. The device as set forth in claim 8, further comprising:
   a plurality or second switches, each connected to between one of said sense amplifiers and one of said local data input/output line pairs; and
   a plurality of decoders, each connected to one column of said second switches, for selecting one column of said sense amplifiers.

10. The device as set forth in claim 9, wherein said decoders are arranged adjacent to said differential amplifier.

* * * * *